United States Patent [19]

Shoji

[11] Patent Number: 4,670,670

[45] Date of Patent: Jun. 2, 1987

[54] CIRCUIT ARRANGEMENT FOR CONTROLLING THRESHOLD VOLTAGES IN CMOS CIRCUITS

[75] Inventor: Masakazu Shoji, Warren, N.J.

[73] Assignee: American Telephone and Telegraph Company AT&T Bell Laboratories, Murray Hill, N.J.

[21] Appl. No.: 658,207

[22] Filed: Oct. 5, 1984

[51] Int. Cl.$^4$ .................. H03L 1/00; H03K 19/003; H03K 19/007; G05F 5/00

[52] U.S. Cl. .................. 307/297; 307/442; 307/200 B; 307/491; 307/308; 307/304; 307/496

[58] Field of Search .................. 307/442, 443, 296 R, 307/296 A, 297, 304, 491, 496, 308; 330/253, 200 B

[56] References Cited

U.S. PATENT DOCUMENTS

| | | | |
|---|---|---|---|
| 4,435,652 | 3/1984 | Stevens | 307/297 |
| 4,471,290 | 9/1984 | Yamaguchi | 307/304 X |
| 4,549,096 | 10/1985 | Hoffmann | 307/297 |

OTHER PUBLICATIONS

Debar, "Dynamic Substrate Bias to Achieve Radiation Hardening"; IBM-TDB; vol. 25, No. 11A, pp. 5829-5830; 4/1983.

Harroun, "Substrate Bias Voltage Control"; IBM-TDB; vol. 22, No. 7, pp. 2691-2692; 12/1979.

Hoffman, "Self-Adjusting Bias Current Generator for IC Amplifier"; IBM-TDB; vol. 23, No. 7B, pp. 3330-3331; 12/1980.

R. T. Davis, M. H. Woods, W. E. Will, P. R. Measel, "High-Performance MOS Resists Radiation", *Electronics*, Nov. 17, 1982, pp. 137-139.

*Primary Examiner*—Larry N. Anagnos
*Attorney, Agent, or Firm*—David I. Caplan

[57] ABSTRACT

The threshold voltage of a CMOS circuit is stabilized by a feedback loop which responds to variations in threshold voltage of a reference FET to provide a backbias voltage to readjust the threshold voltage of a second FET. The circuit is particularly useful to overcome threshold variations due to γ-radiation.

4 Claims, 4 Drawing Figures

CIRCUIT ARRANGEMENT FOR CONTROLLING THRESHOLD VOLTAGES IN CMOS CIRCUITS

FIELD OF THE INVENTION

This invention relates to complementary metal-oxide-semiconductor (CMOS) circuits and, more particularly, to such a circuit with provision for adjusting variations in threshold voltage as might occur during exposure to γ-radiation.

BACKGROUND OF THE INVENTION

It is generally believed that a CMOS, very large scale integrated (VLSI) circuit, is highly sensitive to γ-radiation and that circuit failure due to exposure to γ-radiation is caused by a shift in the threshold voltage of the field effect transistors (FETs) in the circuit.

The proposed mechanism on which such a belief is based differs for N-channel and P-channel field effect transistors (NFETs and PFETs) as follows. When γ-radiation (photons) penetrates the thin gate oxide of an NFET, electron-hole pairs are created in the oxide. The electrons are quickly swept away from the oxide. The holes move more slowly. Many are trapped at the Si-SiO$_2$ interface, thereby creating positively charged traps. At relatively low γ-dosage, the extra positive charge is operative to reduce the threshold voltage of the NFET, an effect which is enhanced when a positive gate voltage is applied to the NFET. At very high γ-dosage (in excess of 10$^6$ rad [absorption dosage in silicon]), migrating holes appear to create negatively charged traps at the interface by some mechanism which is, as yet, not understood in the art. The negatively charged traps, and the threshold voltage as well, increase with increasing dosage.

In PFETs, the effect due to γ-radiation is different. In a PFET having a negative gate voltage applied, the fast moving electrons of the electron-hole pairs created in the gate oxide are swept away mostly to the channel and the slow moving holes are collected by the gate electrode. Holes are not trapped to any significant extent within the oxide. Therefore, the effect of γ-radiation on the PFET threshold voltage is much less than that of the NFET.

The above mechanism leads one to the conclusion that the threshold voltage shift, for either NFETs or PFETs, is (amongst other things) proportional to both the number of electron-hole pairs created and the number of possible trapping sites. Since both the number of trapping sites and the number of electron-hole pairs are proportional to the oxide thickness, the threshold voltage (shift) is proportional to the square of the thickness of the gate oxide.

The above-described proposed mechanism has led some workers in the art to the optimistic projection that radiation effects would be small in very small feature size technology with very small gate oxide thicknesses below 250 Angstroms. This projection was seemingly confirmed in testing of random access memory (RAM) and some microprocessors reported in the literature (see, for example, R. T. Davis, M. H. Woods, W. E. Will and P. R. Measel, "High-performance MOS resists radiation", *Electronics*, Nov. 17, 1982, pp. 137-139). The optimism is based on an extrapolation of the functional dependence of the threshold variation on the gate oxide thickness into the range of such very small oxide thicknesses. Applicant's work indicates that such an extrapolation is unwarranted and that undesirable threshold variation effects will continue to be a problem even in the case of very thin gate oxides.

Moreover, threshold shifts due to other causes also produce failres in CMOS circuits. It would therefore be desirable to have CMOS circuits which are less susceptible to failures due to threshold shifts.

BRIEF DESCRIPTION OF THE INVENTION

The present invention is based on the realization that circuit techniques can be used to provide an adaptive feedback arrangement for adjusting threshold excursions whether cased by γ-radiation or by any other circuit variation.

It is well known that the threshold voltage of an FET can be controlled by applying a backbias voltage, i.e., a steady voltage between the source and substrate of the FET. Ordinarily, such a voltage is applied—for example, by a "charge pump"—to reduce PN junction parasitic capacitance. In this connection a "charge pump" is a circuit which creates a voltage having a value lying outside of the range of the power supply voltage. It is contemplated in accordance with this invention to apply a backbias voltage via a feedback circuit that is stable against γ-radiation and against any other circuit variations and that is referenced to the desired thresold voltage. The threshold voltage of an FET is set at a desired value and the feedback circuit is operative to compensate for any variation of the threshold voltage.

DETAILED DESCRIPTION

Figure 1:
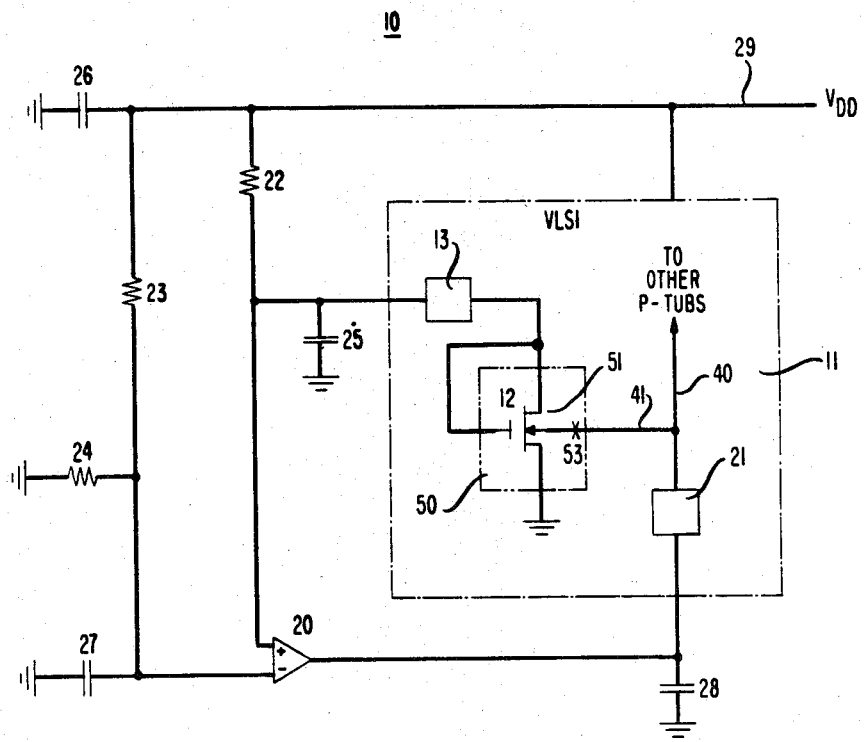
FIG. 1 is a schematic representation of a circuit arrangement in accordance with this invention.

FIG. 1 shows a portion 10 of a CMOS VLSI system including representative MOS integrated circuit 11 (i.e., a CMOS chip) subject to threshold voltage variation because of, for example, exposure to γ-radiation. Circuit 11 includes an NFET 12 connected source to drain between a pad 13 and ground as shown. The gate electode of NFET 12 also is connected to pad 13. Pad 13 comprises an output of circuit 11. Power (V$_{DD}$) is supplied to an N-Tub area, coincident with the broken line indicating the boundary of circuit 11 and in which circuit 11 is formed.

A feedback loop comprising operational amplifier (op-amp) 20 is provided to adjust for any variation in the threshold of FET 12. The output of op-amp 20 is connected to pad 21. Pad 21 also is connected to any other P-Tubs which might be formed within chip 11. The positive input of op-amp 20 is connected to pad 13 and to resistor 22 in order to provide information as to the conductivity of the NFET 12. In this connection, NFET 12 is maintained at a state between the conducting and the nonconducting state and resistor 22 has a value chosen to maintain NFET 12 in that "between" state. Any variation of NFET 12 from this between state results in a large change in conductivity which affects the positive input voltage of op-amp 20. NFET 12 thus functions as a reference transistor within chip 11.

The negative input to op-amp 20 is maintained at a voltage determined by resistors 23 and 24 and the supply voltage $V_{DD}$ and is set to the threshold voltage of FET 12 required by design considerations. The two resistors are of similar construction (material, dimensions and placement) so that any resistance change in them due to γ-radiation affects both resistors essentially alike.

Capacitors 25, 26 and 27 are present only for noise reduction. Capacitor 28 serves a similar function with respect to the output of op-amp 20.

Figure 2:
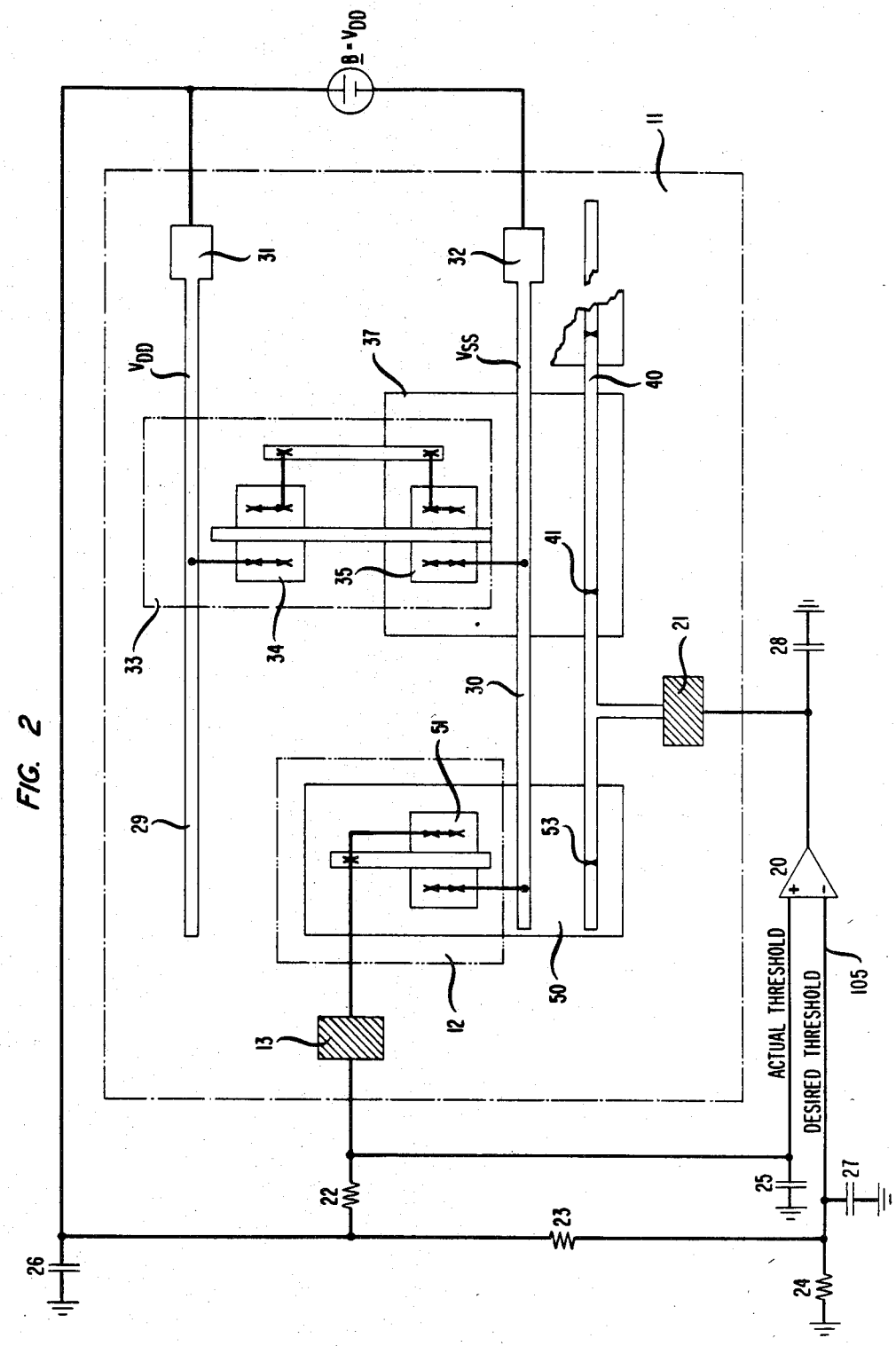
FIG. 2 is an enlarged schematic top view of an implementation of the circuit of FIG. 1.

FIG. 2 shows the structural details of the schematic representation of FIG. 1. Chip 11 includes a power ($V_{DD}$) bus 29 and a ground bus ($V_{SS}$) connected to pads 31 and 32, respectively. Gate 33 comprises PFET 34 and NFET 35 connected to $V_{DD}$ and $V_{SS}$, respectively, as shown. The NFET is defined within P-Tub 37 but there is no through connection from ($V_{SS}$) bus 30 to the P-Tub as is conventional.

Instead an additional electrical conductor 40 is provided. A through connection is provided from conductor 40 to P-Tub 37 at the contact shown by x-sign 41. Such an additional conductor as well as the through connection to the P-Tub also are not present in prior art circuit arrangements. Note also that conductor 40 is connected to pad 21. The output of op-amp 20 (see FIG. 1 also) is connected to pad 21 and thus to P-Tub 37.

The reference transistor 12 of FIG. 1 is shown in association with P-Tub 50 in FIG. 2. Specifically, NFET 51 is connected between bus 30 ($V_{SS}$) and pad 13 as shown in FIGS. 1 or 2. Note that the P-Tub (50) also is connected to conductor 41 at 53. Resistor 22 is chosen to be much larger (i.e., $10^4$) than the transistor channel resistance when the FET is on (about 100 ohms) so that transistor 12 is almost at the threshold voltage. Further, the reference voltage (at the negative input of 20) = $V_{DD} \cdot (R23/(R24+R23)) = 0.5$ V typically, where $R_{23}$, $R_{24}$ and $R_{22}$ are the resistances of the resistors designated 23, 24 and 22, respectively, in FIG. 2. The instantaneous voltage of NFET 12 appears at the positive input of op-amp 20; the desired threshold appears at the negative input.

Any threshold voltage variation due to radiation or to any other cause is corrected by op-amp 20 in a feedback loop which provides a backbias voltage to the substrate (P-Tub 37). The backbias voltage also sets the threshold voltage (of NFET 35) at the known value set at the negative terminal of op-amp 20. The correction occurs because radiation also effects the state of NFET 12 and thus the output of the feedback loop which determines the threshold voltage. This circuit organization is to be contrasted with the usual manner of setting the FET threshold value during processing in which the semiconductor substrate is formed in a manner to change the doping just below the surface channel. In the absence of the op-amp, the threshold is reduced and the circuit (particularly NFETs) becomes very noise sensitive. The feedback loop has the added advantage that the voltage drop relative to $V_{DD}$ is determined by resistors which are radiation-hardened elements.

The op-amp also is carefully designed to insure that the op-amp offset voltage does not change due to radiation since such a change causes inaccuracies in the threshold settings. The output of an op-amp is positive if the positive input to the op-amp is greater than the negative input, and negative if the opposite is true—in theory. In practice, the output is positive if the positive input is greater than the negative input by a voltage in excess of an offset voltage characteristic of the particular op-amp. The op-amp of FIGS. 1 and 2 is designed so that the offset voltage remains unchanged even if the threshold voltage of the FETs constituting the op-amp circuit shown in FIG. 3 varies. Such a result is insured by making the critical components within the op-amp symmetrical as shown in FIG. 4, and by using PFETs (rather than NFETs) in any sensitive component.

Figure 3:
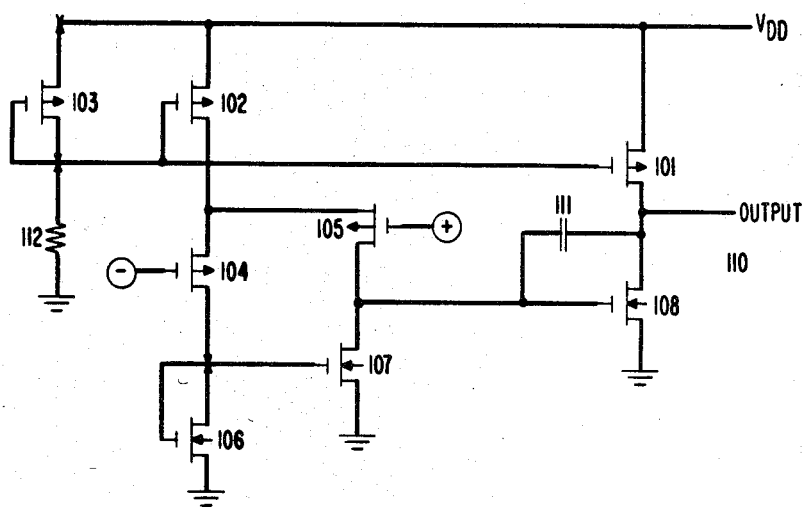
FIG. 3 is a circuit diagram of a prior art op-amp.
Figure 4:
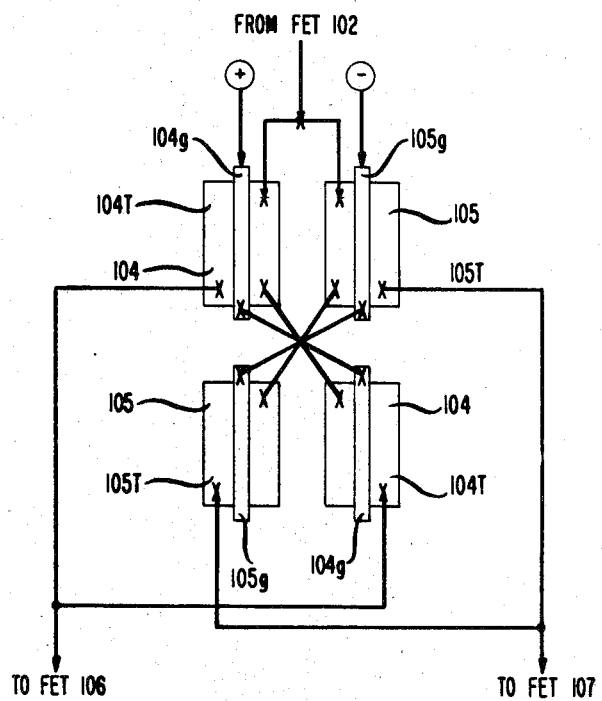
FIG. 4 is a schematic top view, enlarged, of a symmetrical organization of critical components of an op-amp of the type shown in FIG. 3 in accordance with the present invention.

FIG. 3 shows a circuit schematic for a conventional op-amp. The op-amp comprises a plurality of PFETs and NFETs connected source to drain between supply voltage $V_{DD}$ and ground. Three PFETs, 101, 102, and 103, are connected to $V_{DD}$ as shown. The drain of PFET 102 is connected to the sources of PFETs 104 and 105. The drains of PFETs 104 and 105 are connected to the drains of NFETs 106 and 107. The sources of NFETs 106 and 107 are connected to ground. The gates of NFETs 106 and 107 are connected electrically. The drain of PFET 101 is connected to the drain of NFET 108, the source of which is connected to ground. The drains of PFET 105 and NFET 107 are connected to the gate of NFET 108 and to output 110 via capacitor 111. The drain of PFET 103 is connected to ground via a resistor 112. The positive and negative inputs to the op-amp are the gates of PFETs 105 and 104, respectively.

The op-amp offset voltage is rendered insensitive to γ-radiation by making PFETs 104 and 105 symmetrical so that they are affected alike by γ-radiation. Symmetry is achieved by, for example, defining each of PFETs 104 and 105 in the N-Tub diffusion area and by connecting associated areas so that the devices are symmetric. Such an arrangement is illustrated in FIG. 4. The conventional symbol is shown for each of the PFETs in FIG. 4 with two independent P diffused areas 104T and a gate 104g comprising the elements of PFET 104. Similarly, 105T and 105g are the two independent elements of PFET 105. The two gates and P diffused areas 104g and 104T are connected in parallel as are the two gates and P diffused areas 105g and 105T, as shown. The positive gate input (104g) and negative input (105g) are shown in FIG. 4 as well as the drains and the sources (see FIG. 2). As long as symmetry requirements of the components of the op-amp are met, an unwanted change in the op-amp offset voltage is avoided even though changes in the threshold voltage of FETs may occur.

The system of FIGS. 1 and 2 may comprise a plurality of chips 11. Each such circuit includes its own NFET 12. In each instance, NFET 12 is accompanied by various resistances which maintain it in a between state to supply the requisite conductivity information to the positive input of an associated op-amp. But each of chips 11 may include a plurality of P-Tubs and these may share backbias bus 40 of FIG. 2.

What is claimed is:

1. A system comprising at least one CMOS integrated circuit chip, said chip including at least a first FET having a threshold voltage,
   said system further including a reference voltage terminal and feedback means for applying a backbias voltage to said first FET to correct for variations in said threshold voltage,
   said feedback means including an auxiliary FET with its gate terminal being coupled to its drain terminal, and with its drain terminal being coupled through a first resistor to the voltage reference terminal, said auxiliary FET and said first FET being integrated in said chip, said feedback means further including second and third resistors connected in series between the reference voltage terminal and a source terminal of the auxiliary FET, and said feedback means still further including an operational amplifier having a noninverting input terminal that is coupled to the drain terminal of the auxiliary FET and having an inverting terminal that is coupled to a node located between the second and third resistors, and said amplifier also having an output terminal coupled to the auxiliary FET and to the first FET in order to apply said backbias voltage thereto.

2. The system of claim 1 in which the second and third resistors are arranged such that the ratio of their resistances is a constant even when exposed to γ-radiation.

3. The system of claim 2 in which said operational amplifier has an offset voltage and in which said operatinal amplifier includes first and second input transistors each of which comprises two mutually similar separate parts connected together in parallel, each of said two separate parts of each of said input transistors being formed in a separate diffusion tub, in order to avoid a change in said offset voltage.

4. The system of claim 1 in which said operational amplifier has an offset voltage and in which said operational amplifier includes first and second input transistors each of which comprises two mutually similar separate parts connected together in parallel, each of said two separate parts of each of said input transistors being formed in a separate diffusion tub, in order to avoid a change in said offset voltage.

* * * * *